United States Patent
Classen et al.

(10) Patent No.: US 8,956,544 B2
(45) Date of Patent: Feb. 17, 2015

(54) METHOD FOR MANUFACTURING A MICROMECHANICAL STRUCTURE, AND MICROMECHANICAL STRUCTURE

(75) Inventors: Johannes Classen, Reutlingen (DE);
Jochen Reinmuth, Reutlingen (DE);
Sebastian Guenther, Tuebingen (DE);
Pia Bustian-Todorov, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 290 days.

(21) Appl. No.: 13/586,226

(22) Filed: Aug. 15, 2012

(65) Prior Publication Data

US 2013/0042681 A1 Feb. 21, 2013

(30) Foreign Application Priority Data

Aug. 16, 2011 (DE) .......................... 10 2011 081 033

(51) Int. Cl.
| | | |
|---|---|---|
| *C23F 1/00* | (2006.01) | |
| *G01C 19/5783* | (2012.01) | |
| *B81C 1/00* | (2006.01) | |
| *G01P 15/08* | (2006.01) | |

(52) U.S. Cl.
CPC ........ *G01C 19/5783* (2013.01); *B81C 1/00182* (2013.01); *G01P 15/0802* (2013.01); *B81B 2201/025* (2013.01); *G01P 2015/0882* (2013.01)
USPC ......... 216/2; 216/41; 216/56; 216/79; 216/99

(58) Field of Classification Search
USPC ...................................... 216/2, 41, 56, 79, 99
See application file for complete search history.

(56) References Cited

U.S. PATENT DOCUMENTS

| | | | |
|---|---|---|---|
| 5,756,901 A | 5/1998 | Kurle et al. | |
| 6,030,850 A | 2/2000 | Kurle et al. | |
| 2009/0261387 A1* | 10/2009 | Adam et al. | 257/254 |
| 2011/0018078 A1* | 1/2011 | Feyh | 257/417 |
| 2011/0260268 A1* | 10/2011 | Lee et al. | 257/416 |
| 2012/0068277 A1* | 3/2012 | Kautzsch et al. | 257/418 |
| 2012/0175714 A1* | 7/2012 | Lakamraju et al. | 257/415 |
| 2012/0274647 A1* | 11/2012 | Lan et al. | 345/531 |
| 2013/0032385 A1* | 2/2013 | Lin et al. | 174/260 |
| 2013/0099292 A1* | 4/2013 | Nakatani | 257/254 |

FOREIGN PATENT DOCUMENTS

DE 195 37 814 4/1997

\* cited by examiner

*Primary Examiner* — Binh X Tran
(74) *Attorney, Agent, or Firm* — Kenyon & Kenyon LLP

(57) ABSTRACT

A method for manufacturing a micromechanical structure, and a micromechanical structure. The micromechanical structure encompasses a first micromechanical functional layer, made of a first material, that comprises a buried conduit having a first end and a second end; a micromechanical sensor structure having a cap in a second micromechanical functional layer that is disposed above the first micromechanical functional layer; an edge region in the second micromechanical functional layer, such that the edge region surrounds the sensor structure and defines an inner side containing the sensor structure and an outer side facing away from the sensor structure; such that the first end is located on the outer side and the second end on the inner side.

5 Claims, 22 Drawing Sheets

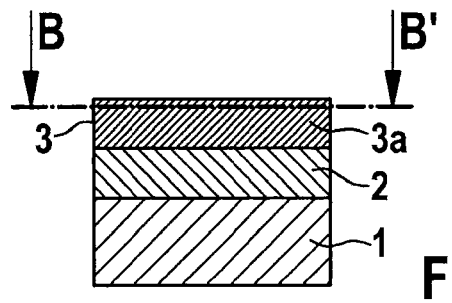
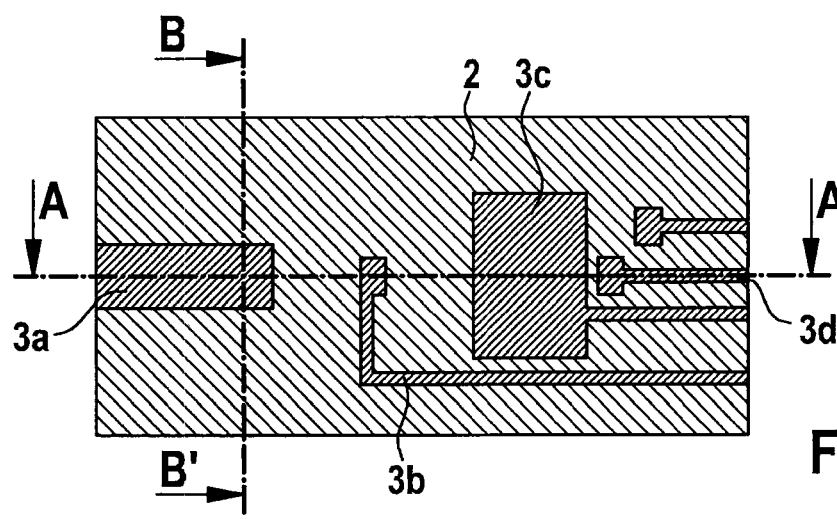

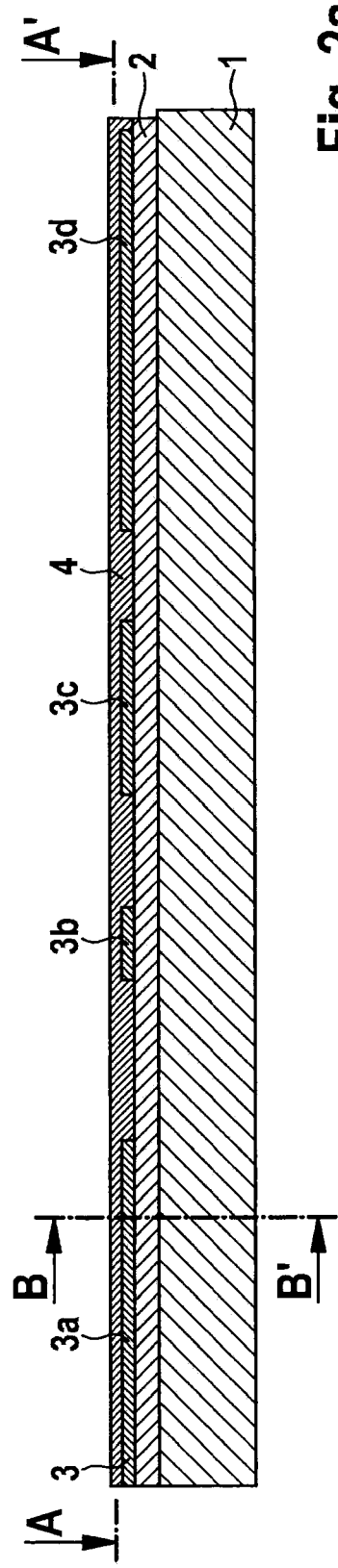

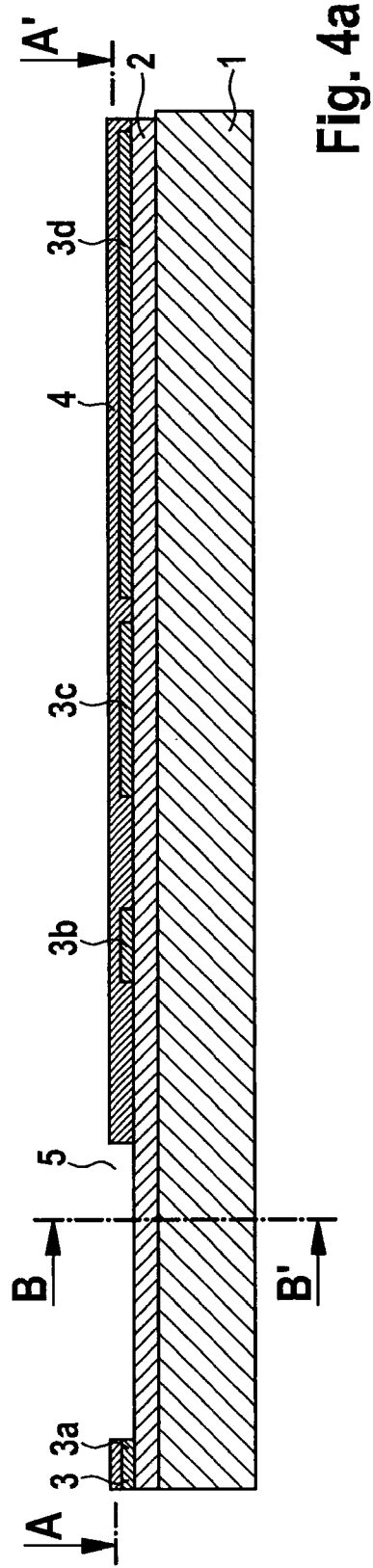

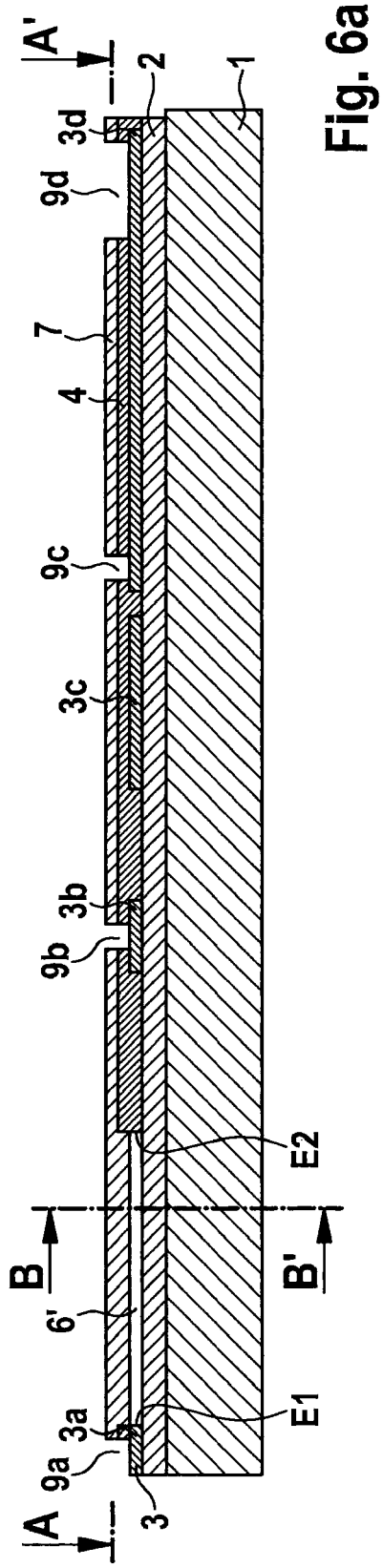

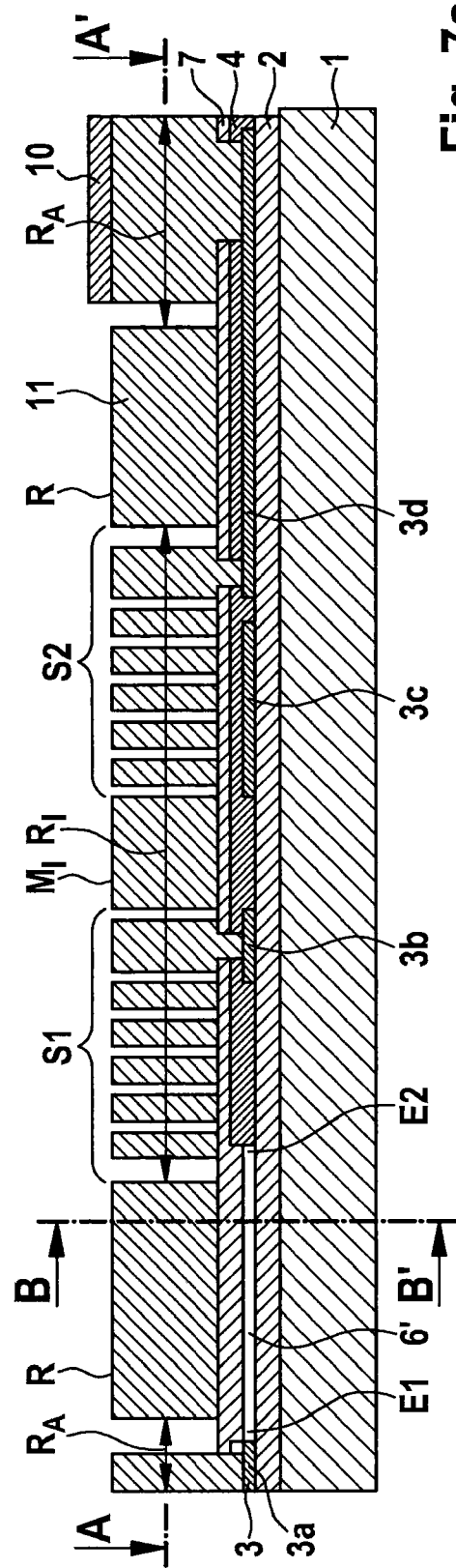

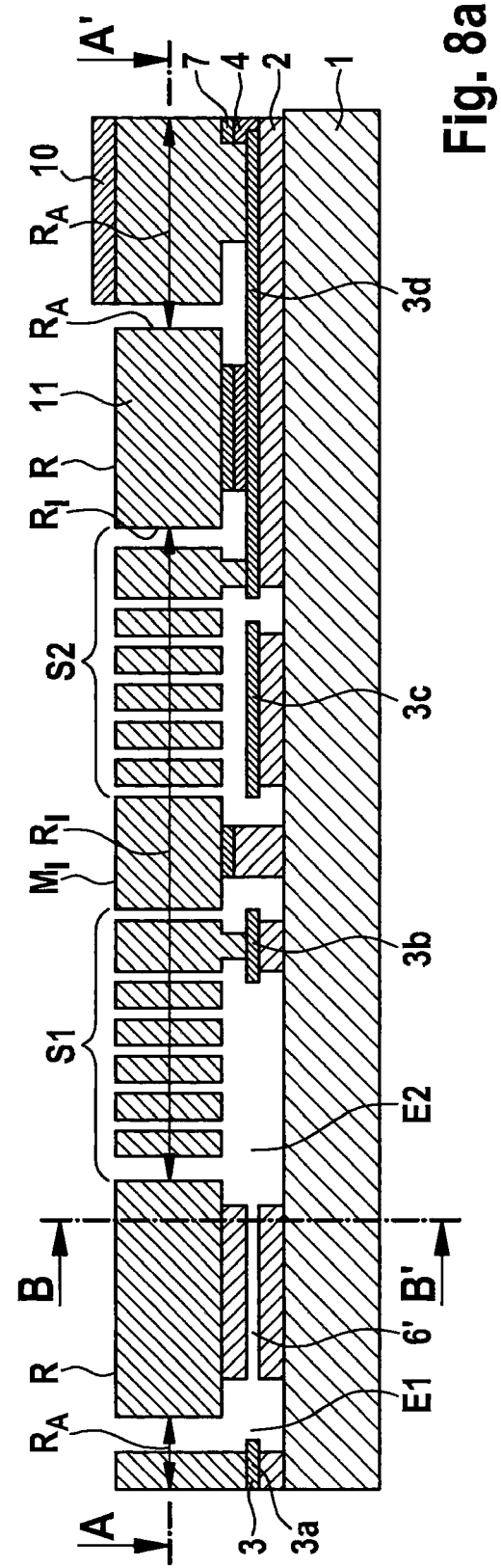

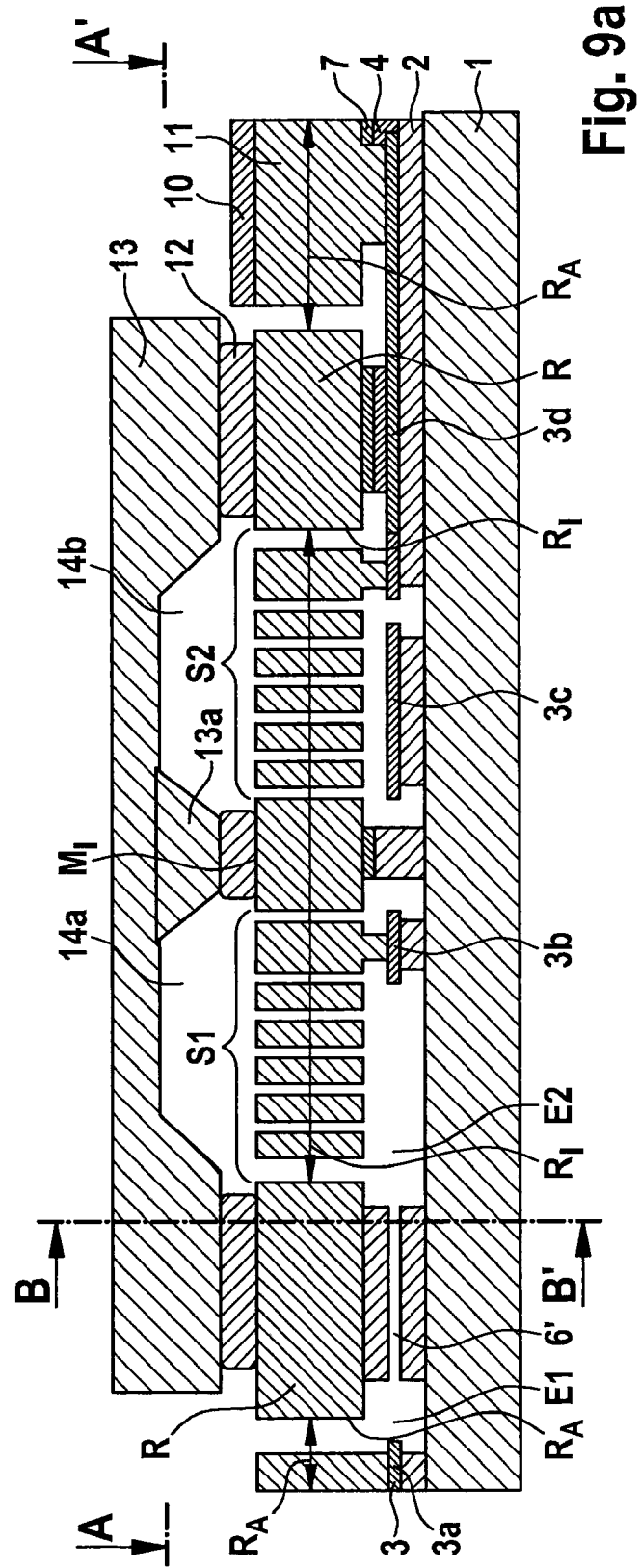

METHOD FOR MANUFACTURING A MICROMECHANICAL STRUCTURE, AND MICROMECHANICAL STRUCTURE

CROSS REFERENCE

The present application claims the benefit under 35 U.S.C. §119 of German Patent Application No. DE 102011081033.1 filed on Aug. 16, 2011, which is expressly incorporated herein by reference in its entirety.

FIELD OF THE INVENTION

The present invention relates to a method for manufacturing a micromechanical structure, and to a micromechanical structure.

BACKGROUND INFORMATION

Although it is applicable to any micromechanical components, the present invention and its underlying problem will be explained below with reference to acceleration and rotation rate sensors.

German Patent Application No. DE 195 37 814 A1 describes a method for manufacturing micromechanical sensors, for example acceleration and rotation rate sensors. Movable silicon structures, whose motions are sensed quantitatively by determining capacitance changes, are generated. The movable silicon structures are generated in an etching step, trenches being generated with a high aspect ratio in the silicon layer. In a second step a sacrificial layer, for example an oxide layer, is removed from beneath the micromechanical functional layer made of silicon. In a subsequent process the movable silicon structures thereby obtained are hermetically closed off, for example with a cap wafer that is applied using a seal-glass soldering process. Depending on the application, a gas atmosphere having a desired or suitable pressure is enclosed inside the volume closed off by the cap wafer.

In rotation rate sensors, a very low pressure is typically enclosed, for example on the order of 1 mbar. The background for this is that in these rotation rate sensors, a portion of the movable structure is driven resonantly. At very low pressure, it is very easy to excite a desired vibration with relatively small electrical voltages, because of the very low damping.

In acceleration sensors, on the other hand, it is usually not desirable for the sensor to vibrate, which is possible when a corresponding external acceleration is applied. These acceleration sensors are therefore operated at higher pressures, for example at 500 mbar. In addition, the surfaces of such acceleration sensors are often also equipped with organic coatings that prevent adhesive bonding of the movable structures.

If the intention is to manufacture very small and economical combinations of rotation rate and acceleration sensors, this can be done by integrating both a rotation rate sensor and an acceleration sensor onto one chip. The two sensors are manufactured simultaneously on one substrate. Such sensor combinations are encapsulated at the substrate level by way of a cap wafer that provides two separate cavities per chip.

The different pressures that are required in the cavities of the rotation rate sensor and of the acceleration sensor can be achieved, for example, by using a getter. For this, a suitable getter is locally incorporated into the cavity of the rotation rate sensor. A high pressure is initially enclosed in both cavities. The getter is then activated by way of a temperature step, whereupon said getter then pumps or getters the cavity volume of the rotation sensor to a low pressure.

SUMMARY

The present invention relates to a method for manufacturing a micromechanical structure, and a micromechanical structure.

In accordance with the present invention, a buried conduit is provided beneath an edge region of the cap in such a way that said conduit forms a fluid connection between the encapsulated volume and the environment.

If the intention is to manufacture a sensor combination, for example a rotation rate sensor and an acceleration sensor, in economical fashion, it is possible by way of the example method according to the present invention to provide a cap sensor that has two cavity regions, and firstly to apply the cap wafer in such a way that the cavity of the acceleration sensor is hermetically closed off at a desired low pressure. A desired atmosphere is then established in the cavity region of the rotation rate sensor through the buried conduit according to the present invention, whereupon the buried conduit is closed off.

The example manufacturing method according to the present invention is compatible with known manufacturing processes for acceleration and rotation rate sensors, and other known micromechanical sensors that have a cap.

The manufacturing technique according to the present invention is economical, simple, and robust.

BRIEF DESCRIPTION OF THE DRAWINGS

Further features and advantages of the present invention are explained below in terms of embodiments with reference to the Figures.

DETAILED DESCRIPTION OF EXAMPLE EMBODIMENTS

Figure 1A:
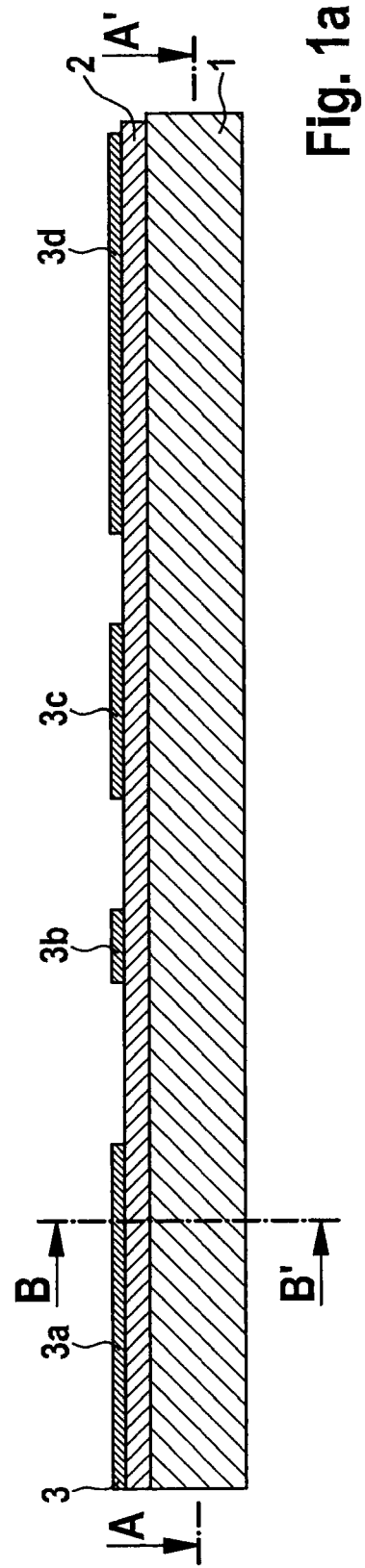
FIGS. 1a), b), c) to FIGS. 11a), b), c) are schematic cross-sectional views to explain an example method for manufacturing a micromechanical structure in accordance with an embodiment of the present invention, each Figure part a) showing a cross section along line A-A', each Figure part b) showing a partial cross section along line B-B', and each Figure part c) showing a plan view.

In the Figures, identical reference characters refer to identical or functionally identical elements.

Referring to FIGS. 1a) to c), reference character 1 designates a silicon semiconductor substrate, for example a silicon wafer.

Firstly an insulation layer 2, for example a silicon oxide layer, is deposited on silicon semiconductor substrate 1. Then a first micromechanical functional layer in the form of a polysilicon layer 3 is deposited on insulation layer 2, doped, and patterned into polysilicon regions 3a, 3b, 3c, 3d in accordance with the micromechanical sensor assemblage to be formed.

Figure 2B:
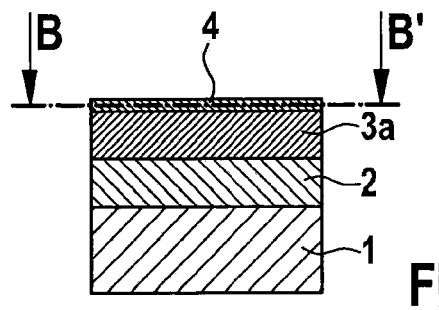
Figure 2C:
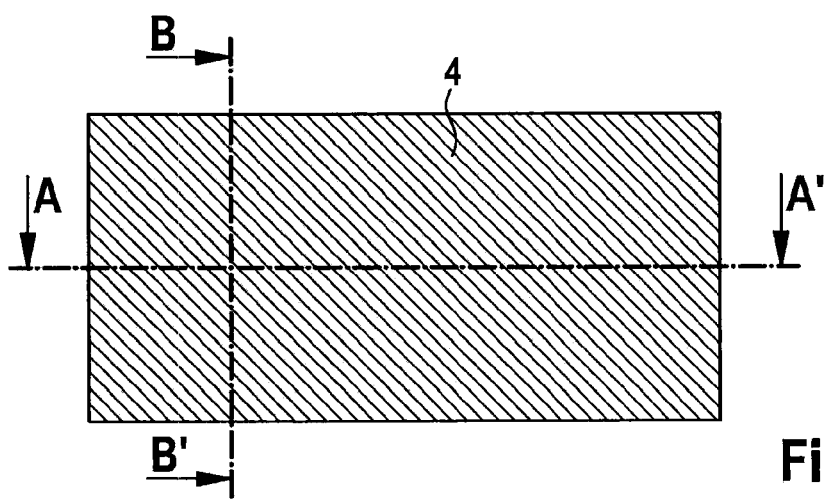

Referring further to FIGS. 2a) to 2c), a further insulation layer 4, for example likewise a silicon oxide layer, is deposited on the patterned first micromechanical functional layer 3 having regions 3a, 3b, 3c, 3d, so that regions 3a, 3b, 3c, 3d are buried beneath it. This insulation layer 4 serves as a masking layer later on in the process.

Figure 3A:
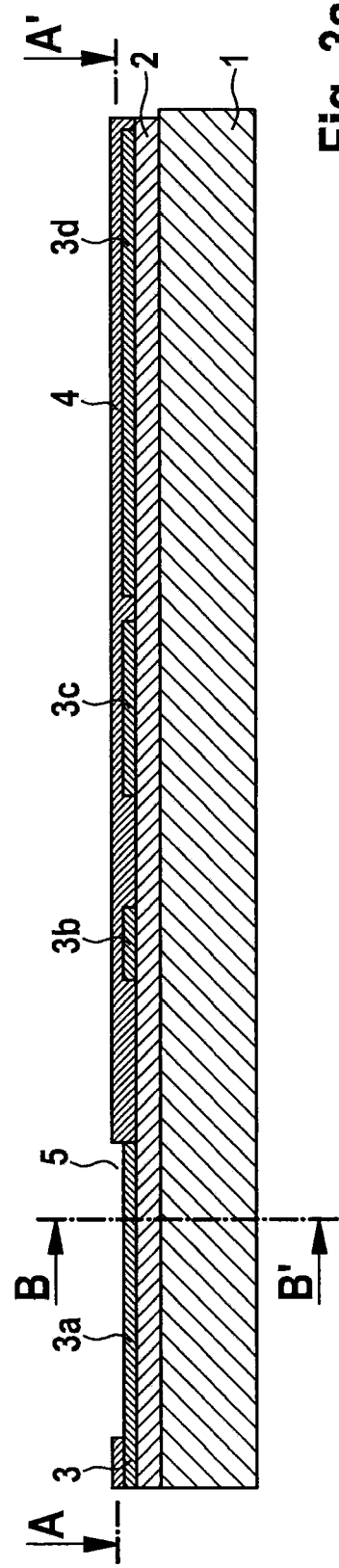
Figure 3B:
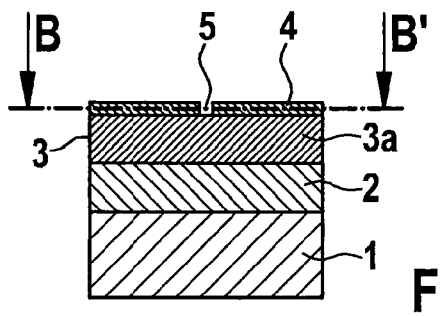
Figure 3C:
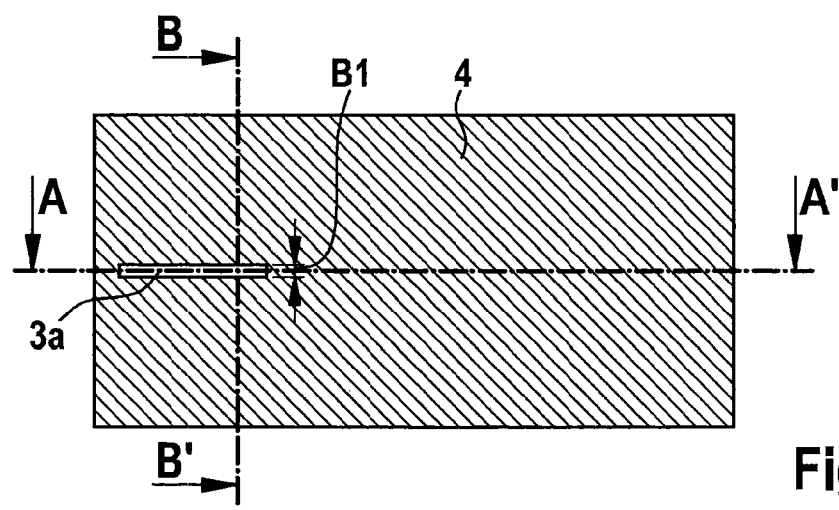

As shown in FIGS. 3a) to 3c), above region 3a and as far as its right-hand edge a longitudinal opening 5 having a first width B1 is formed, for example by way of a corresponding photolithographic process, over a longitudinal region of the buried conduit to be formed later. Advantageously, width B1 is selected to be on the order of the layer thickness of the first micromechanical functional layer 3 made of polysilicon, or in fact somewhat smaller.

According to FIGS. 4a) to 4c), after the formation of elongated opening 5, using insulation layer 4 as a masking layer, region 3a of the first micromechanical functional layer 3 located beneath it is etched, for example with a $SF_6$ plasma. The etching process can advantageously, but need not necessarily, be performed through the entire first micromechanical functional layer 3. When a suitable etching medium is selected, the etching process stops automatically at insulation layer 2 located therebeneath.

Figure 4B:
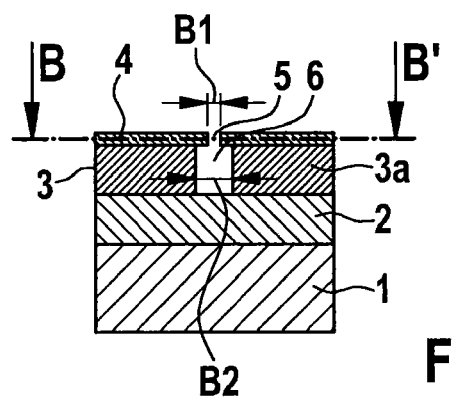
Figure 4C:
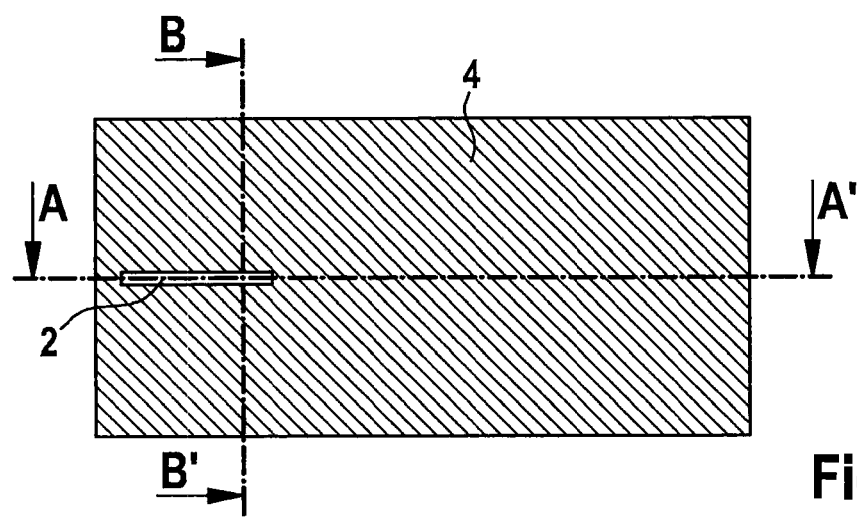

As is evident in particular from FIG. 4b), conduit 6 formed by the etching process is provided in such a way that it has a second width B2 which is greater than first width B1 of opening 5 located thereabove. The result of this, later on in the process, is that opening 5 can be closed off without causing trench 6 therebeneath to be filled completely or to an undesired extent.

Figure 5A:
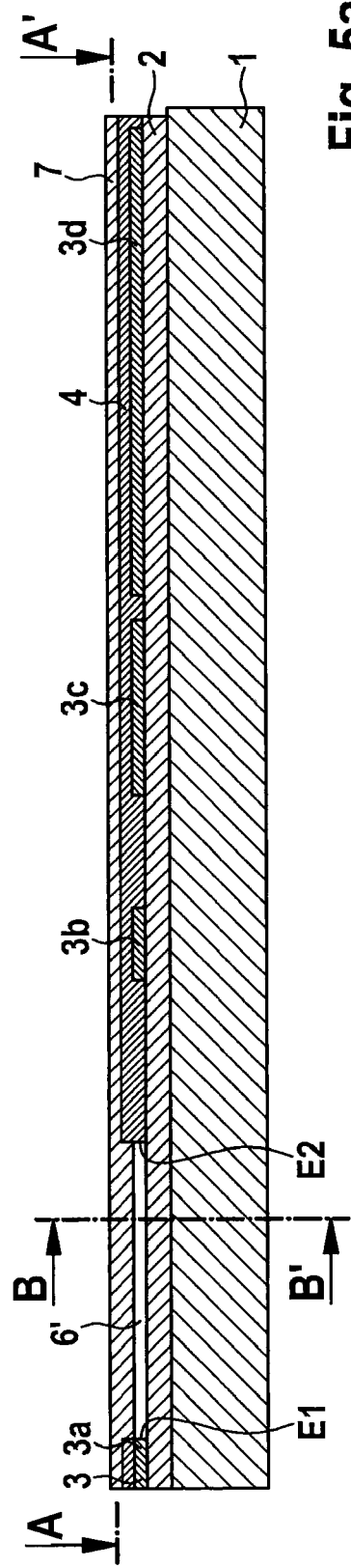
Figure 5B:
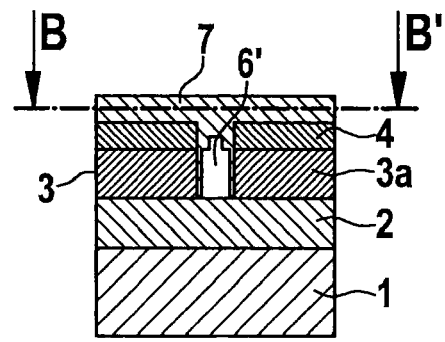
Figure 5C:
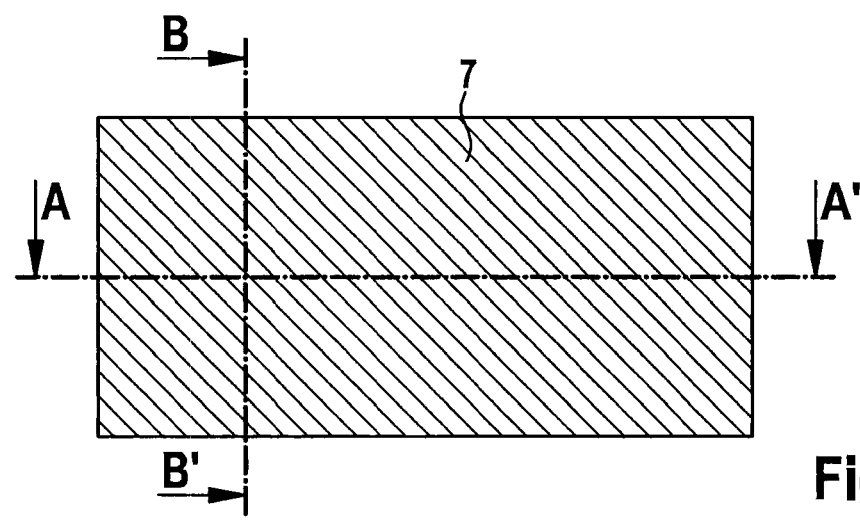

Referring to FIGS. 5a) to 5c), in the next process step a cover layer 7, for example a further silicon oxide layer, is deposited, and conduit 6 is thereby closed off, i.e., a buried conduit 6' is formed which has in a longitudinal direction a first end E1 and a second end E2. As already mentioned, buried conduit 6' is closed off at the level of cover layer 7 because first width B1 is relatively small. Buried conduit 6' manufactured in this fashion forms the later basis of a venting conduit for supplying fluid to a capped volume or sub-volume.

Figure 6B:
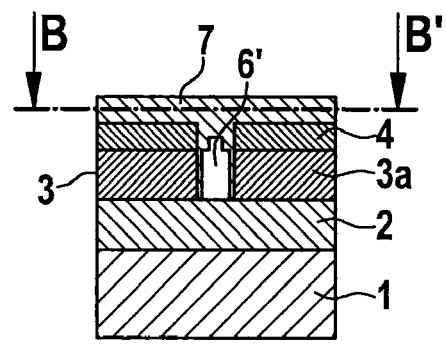
Figure 6C:
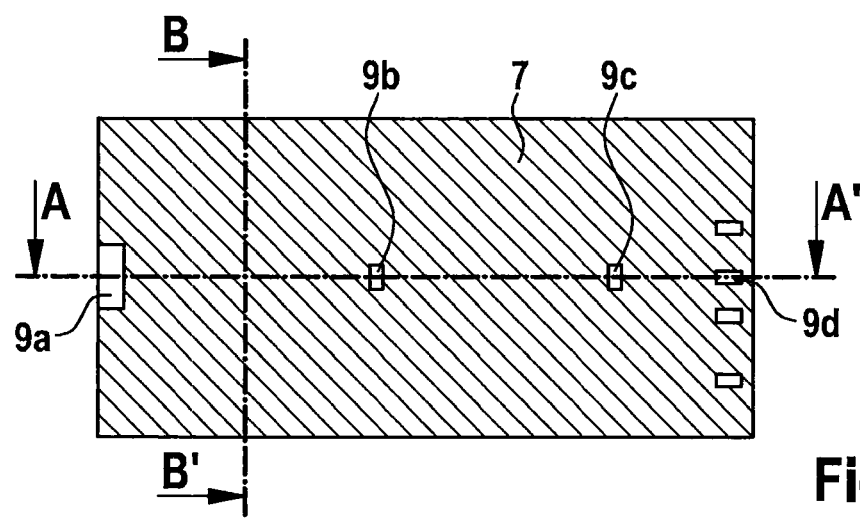

Referring now to FIGS. 6a) to 6c), in the next process step contact openings 9a, 9b, 9c, 9d are formed in cover layer 7; these continue down as far as the thin first micromechanical function layer 1, so that the latter can later be contacted by functional layers located above it.

Figure 7B:
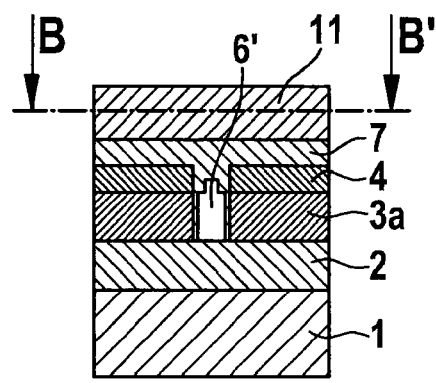
Figure 7C:
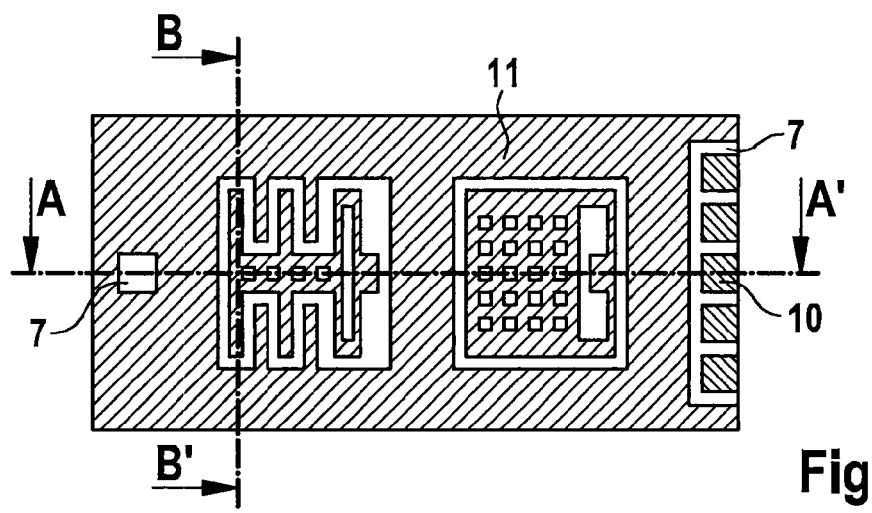

As depicted in FIGS. 7a) to 7c), a relatively thick second micromechanical functional layer 11 made of polysilicon is then deposited above cover layer 7 having contact regions 9, and doped.

A metal layer is then deposited and patterned, thereby manufacturing bonding surfaces 10 for later external electrical connection of sensor structure S1, S2.

Second micromechanical functional layer 11 is then patterned. In particular, a first sensor device S1 is provided in second micromechanical functional layer 11, said device forming an acceleration sensor in the present example, as well as a second sensor device S2 that forms a rotation rate sensor in the present example.

Also provided is an edge region R, surrounding the sensor structure, around the sensor structure having sensor devices S1, S2, as well as a middle region MI that divides the sensor structure into the two sensors S1, S2; both will serve later as a contact region for the cap.

This edge region R defines, in particular, an inner side RI containing sensor structure S1, S2 and an outer side RA facing away from sensor structure S1, S2, the first end of buried conduit 6' being located on outer side RA, and the second end E2 on inner side RI.

As is shown in particular from FIG. 7a), cover layer 7 is exposed, or second micromechanical functional layer 11 above it is removed, at both ends E1, E2, so that first and second end E1, E2 are reachable from the upper side in a later etching process.

As depicted in FIGS. 8a) to 8c), a sacrificial layer etching process then occurs, for example by gas phase etching in HF, which partly removes insulation layers 2, 4 and cover layer 7. This etching process, in particular, releases sensor devices S1, S2, i.e., makes them movable at the desired locations.

Figure 8B:
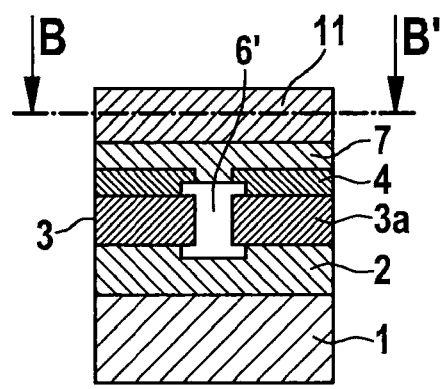
Figure 8C:
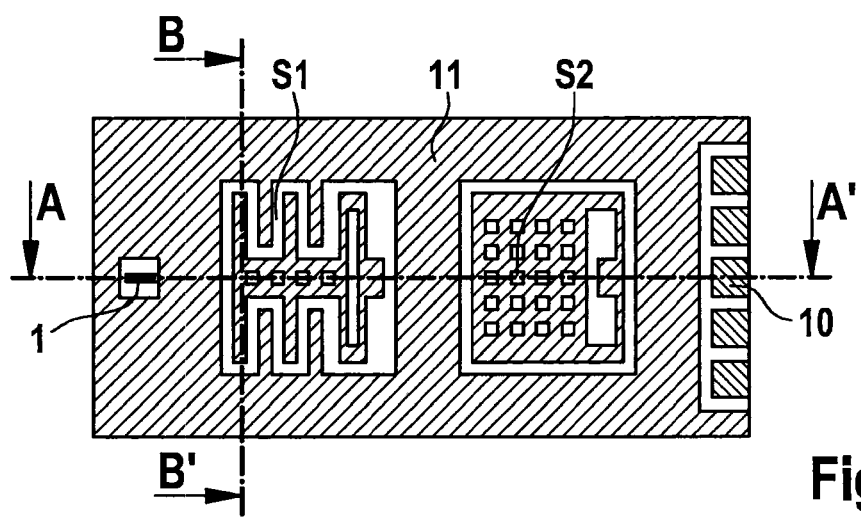

The buried conduit 6' serving for fluid delivery is also opened in this etching process, in which the etching medium is passed through the patterned second micromechanical functional layer 11 at its first and second end E1, E2, and it is also widened in its vertical diameter, as may be gathered in particular from FIG. 8b). Because the etching process, selectively with respect to polysilicon, etches only oxide, the previously formed micromechanical functional structures of the first and second micromechanical functional layers 3, 11 remain undamaged.

Figure 9B:
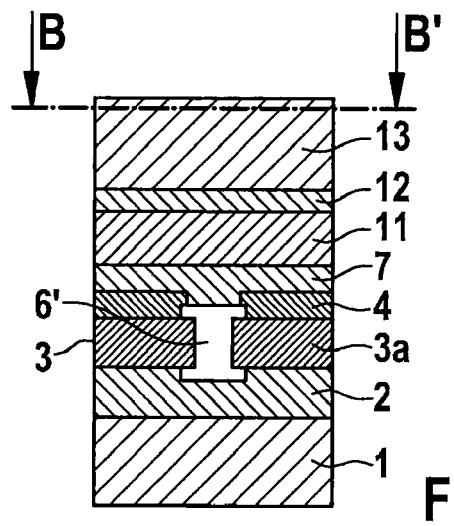
Figure 9C:
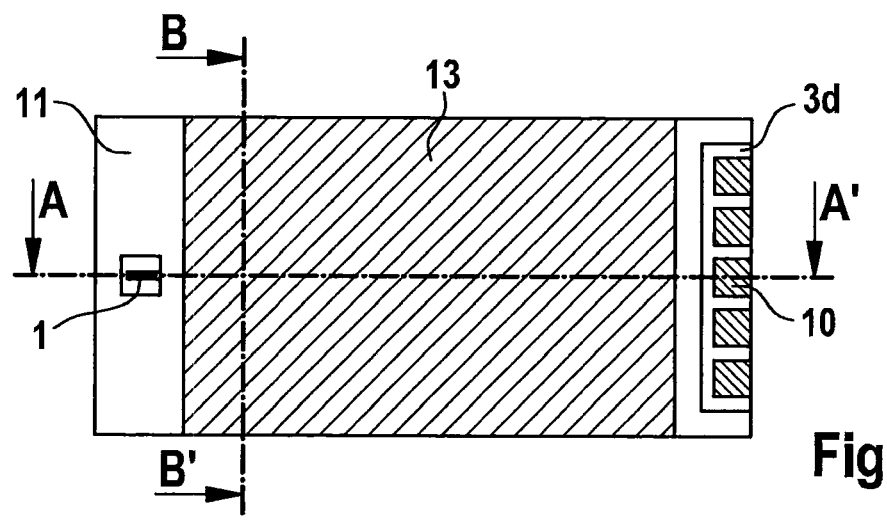

Further referring to FIGS. 9a to 9c), the micromechanical sensor devices S1, S2 of the sensor structure are closed off via a seal-glass layer 12, under a pressure suitable for sensor device S2 and under a correspondingly suitable gas atmosphere, with a cap wafer 13, seal-glass layer 12 being provided on edge region R and middle region MI. Cap wafer 13 has, in particular, a separating region 13a that is coupled via seal-glass layer 12 on a pedestal-shaped middle region MI of second micromechanical functional layer 11 made of polysilicon. Formation of the cap using cap wafer 13 is thus carried out so as to form two cavity regions 14a, 14b hermetically isolated from one another.

Cavity region 14a of acceleration sensor S1 is opened with respect to outer side RA via buried conduit 6', whereas cavity region 14b of rotation rate sensor S2 is closed off with respect to outer side RA and with respect to cavity region 14a of the acceleration sensor. After the capping process, the pressure and gas atmosphere of rotation rate sensor S2 are finally defined; for example, a low pressure of 1 mbar, necessary for low-loss driving, exists in cavity region 14b of rotation rate sensor S2.

By way of a corresponding pumping and venting cycle, acceleration sensor S1 can now be equipped via buried conduit 6', from outer side RA, with an organic anti-adhesion layer (not shown); or other conditioning mechanisms that ensure its interference-free operational reliability can be applied selectively only onto acceleration sensor S1.

Figure 10A:
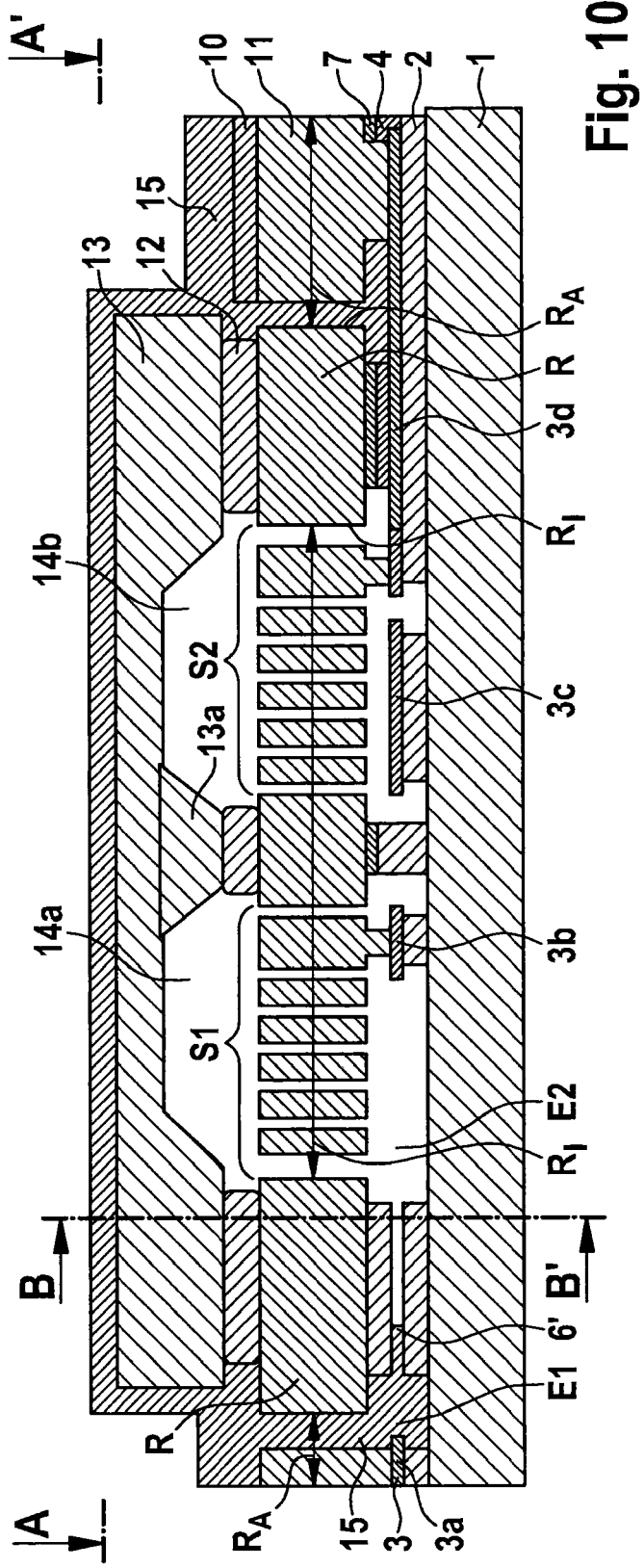
Figure 10B:
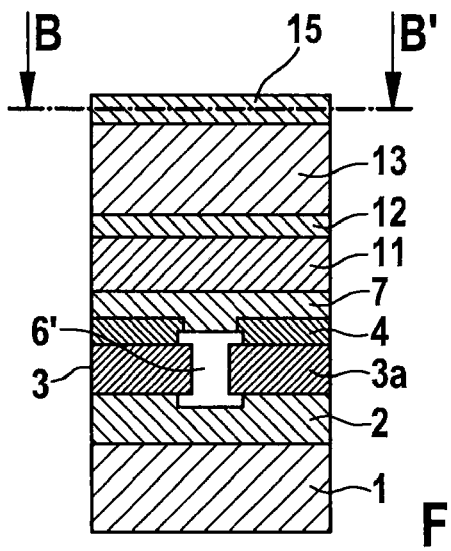
Figure 10C:
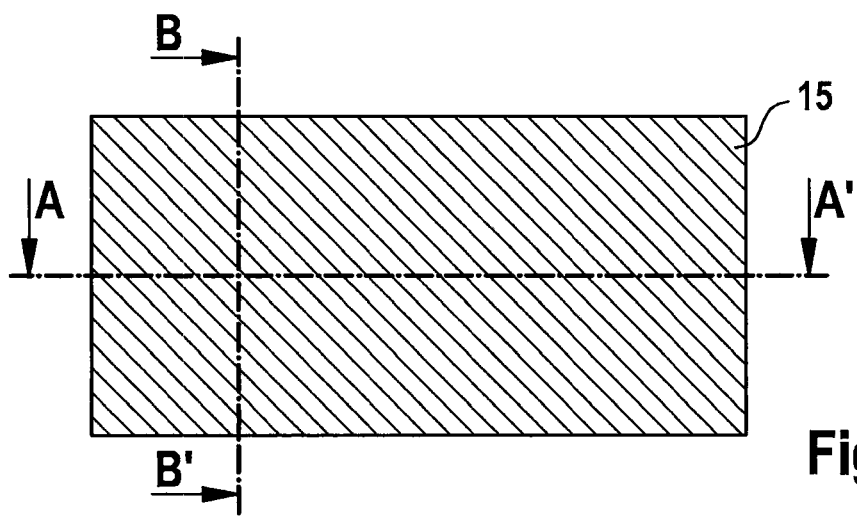

Lastly, referring to FIGS. 10a) to 10c), a suitable conditioning of cavity region 14a of the acceleration sensor in terms of pressure and gas atmosphere is performed, for example a pressure of 500 mbar is established therein, for example by applying a paint layer 15 or a BCB layer. Such materials penetrate far into first cavity region 14a through buried conduit 6'. By full-surface back-etching, for example in an $O_2$ plasma, this paint layer 15 or BCB layer that initially lies areally over the entire structure can be removed again from troublesome locations on the apparatus, and can be left in place at desired locations lower down, for example at the first end of buried conduit 6' so that the latter is finally closed off.

Figure 11A:
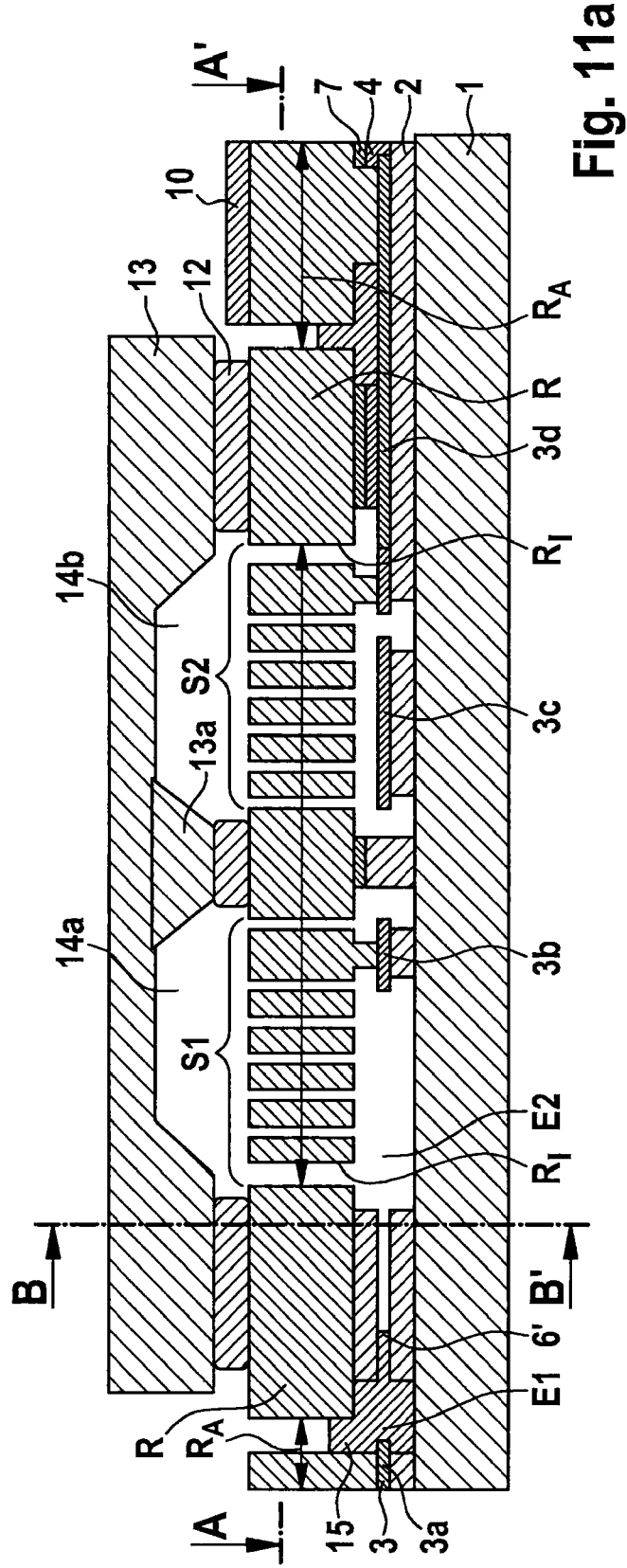
Figure 11B:
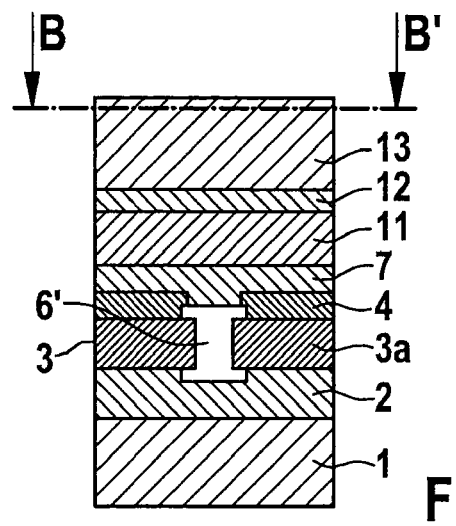
Figure 11C:
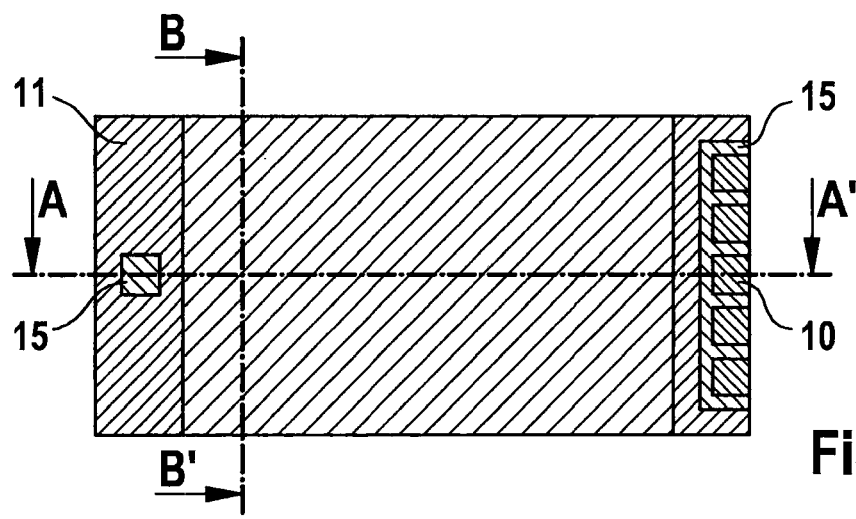

As may be gathered from FIGS. 11a) and 11c), it may be desirable for this paint layer 15 or BCB layer to remain in the region of bonding surfaces 10 for insulation.

Although the present invention has been explained above with reference to two exemplifying embodiments, it is not limited thereto but instead can be varied in many ways.

Although the present invention has been explained with reference to preferred exemplifying embodiments, it is not limited thereto. In particular, the aforesaid materials and topologies are merely exemplifying, and are not limited to the examples explained.

The rate at which the first cavity region having the acceleration sensor is filled with gas or pumped down can be adjusted by way of different cross sections and/or lengths, for example a meander shape, of the buried conduit used for venting, or by way of the number of such buried conduits.

The fields of application are similarly wide-ranging, and are not limited to acceleration and rotation rate sensors. For example, a micromechanical magnetic field sensor, or any other sensor that requires a low pressure, can also be combined with a sensor that requires a higher pressure, for example an acceleration sensor.

It is likewise possible to manufacture additional regions having separate cavities within a chip, and to create, by way of the specific geometry of the gas conduits and a suitable time-related control up to the point of closing off the buried conduits, different gas atmospheres or pressures in more than two cavity regions as present in the exemplifying embodiment above, for example a minimal internal pressure for a first sensor device, a moderate pressure for a second sensor device, and a relatively high pressure for a third sensor device, etc.

Application examples for sensors having more than two different pressures can be combined rotation rate, acceleration, and magnetic field sensors, or also a rotation rate sensor in combination with a multi-axis acceleration sensor in which the higher damping of, for example, the Z conduit is to be compensated for by a lower pressure as compared with the X/Y sensor in order to implement a comparable mechanical bandwidth in the transition characteristic.

What is claimed is:

1. A method for manufacturing a micromechanical structure, comprising:

forming a conduit in a first micromechanical functional layer made of a first material;

closing off the conduit with a cover layer made of a second material to form a buried conduit having a first end and a second end;

forming a second micromechanical functional layer, made of a third material, above the cover layer;

patterning a micromechanical sensor structure and an edge region in the second micromechanical functional layer such that the edge region surrounds the sensor structure and defines an inner side containing the sensor structure and an outer side facing away from the sensor structure, and such that the first end is located on the outer side and the second end is located on the inner side;

opening the buried conduit at the first and the second end in a first etching step such that a first etching medium is passed through the patterned second micromechanical functional layer to the first and the second end, and etches the cover layer selectively with respect to the first micromechanical functional layer and to the second micromechanical functional layer; and forming a cap on the edge region with a result that the opened buried conduit forms a fluid connection between the outer side and the inner side.

2. The method as recited in claim 1, further comprising:

forming a predetermined gas atmosphere in the inner region having the capped sensor structure through the opened buried conduit; and closing off the first end.

3. The method as recited in claim 2, wherein the closing off of the first end is carried out by depositing and partly back-etching a closure layer.

4. The method as recited in claim 1, wherein the sensor structure is patterned in such a way that the sensor structure has a first sensor device having a first cavity region and a second sensor device having a second cavity region, and the formation of the cap is carried out in such a way that the second cavity region is closed off with respect to the outer side and to the first cavity region, with the result that the opened buried conduit forms a fluid connection between the outer side and the first cavity region.

5. The method as recited in claim 1, wherein to form the conduit, a masking layer made of the second material is deposited on the first micromechanical functional layer and is patterned in such a way that it has an opening having a first width over a longitudinal region of the conduit to be formed, such that in a second etching step a second etching medium is passed through the opening to the first micromechanical functional layer and etches the first micromechanical functional layer selectively with respect to the masking layer in order to form the conduit, and such that a second width of the conduit is greater than the first width.

* * * * *